(12) United States Patent
Tsuyuno et al.

(10) Patent No.: US 12,101,915 B2
(45) Date of Patent: Sep. 24, 2024

(54) POWER MODULE, POWER CONVERSION DEVICE, AND METHOD FOR MANUFACTURING POWER MODULE

(71) Applicant: HITACHI ASTEMO, LTD., Hitachinaka (JP)

(72) Inventors: Nobutake Tsuyuno, Tokyo (JP); Akira Matsushita, Hitachinaka (JP); Toru Kato, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 182 days.

(21) Appl. No.: 17/785,297

(22) PCT Filed: Nov. 27, 2020

(86) PCT No.: PCT/JP2020/044166
§ 371 (c)(1),
(2) Date: Jun. 14, 2022

(87) PCT Pub. No.: WO2021/124832
PCT Pub. Date: Jun. 24, 2021

(65) Prior Publication Data
US 2023/0023345 A1  Jan. 26, 2023

(30) Foreign Application Priority Data

Dec. 16, 2019 (JP) ................................ 2019-226530

(51) Int. Cl.
*H05K 7/20* (2006.01)
*H02M 7/00* (2006.01)
*H05K 5/03* (2006.01)

(52) U.S. Cl.
CPC ............ *H05K 7/209* (2013.01); *H02M 7/003* (2013.01); *H05K 5/03* (2013.01); *H05K 7/20927* (2013.01)

(58) Field of Classification Search
CPC ...... H05K 7/209; H05K 5/03; H05K 7/20927; H02M 7/003
(Continued)

(56) References Cited

U.S. PATENT DOCUMENTS 4,233,645 A * 11/1980 Balderes ............. H01L 23/4338
361/698
4,415,025 A * 11/1983 Horvath ................ H01L 23/433
257/E23.09
(Continued)

FOREIGN PATENT DOCUMENTS

JP  2004-103936 A   4/2004
JP  2010177507 A *  8/2010
(Continued)

OTHER PUBLICATIONS

JP-2010177507-A English translation (Year: 2010).*

*Primary Examiner* — Anatoly Vortman
(74) *Attorney, Agent, or Firm* — Foley & Lardner LLP

(57) ABSTRACT

The resin material 336 is arranged in a first region 421 surrounded by the fin base 440, the inclined portion 343 of the cover member 340, and the outermost peripheral heat dissipation fins 334 arranged on the outermost peripheral side. Then, the resin material 336 is caused to protrude to the first region 421. That is, the resin material 336 is arranged in the first region 421. In a cross section perpendicular to the refrigerant flow direction (Y direction), a cross-sectional area of the first region 421 is larger than an average cross-sectional area 423 of the adjacent heat dissipation fins 331. Then, a cross-sectional area of a second region 422 formed between the resin material 336 arranged in the first region 421 and the outermost peripheral heat dissipation fin 334 arranged on the outermost peripheral side is smaller than the average cross-sectional area 423 of the heat dissipation fins.

19 Claims, 15 Drawing Sheets

(58) Field of Classification Search
USPC .......................................................... 361/704
See application file for complete search history.

(56) References Cited

U.S. PATENT DOCUMENTS

| | | | | |
|---|---|---|---|---|
| 4,483,389 | A * | 11/1984 | Balderes | H01L 23/4338 |
| | | | | 257/713 |
| 4,833,567 | A * | 5/1989 | Saaski | F28D 15/046 |
| | | | | 165/104.33 |
| 5,682,288 | A * | 10/1997 | Wani | H01G 11/38 |
| | | | | 429/185 |
| 6,239,359 | B1 * | 5/2001 | Lilienthal, II | H05K 9/0028 |
| | | | | 361/752 |
| 6,407,925 | B1 * | 6/2002 | Kobayashi | H05K 5/0052 |
| | | | | 361/752 |
| 6,679,315 | B2 * | 1/2004 | Cosley | H05K 1/0203 |
| | | | | 257/E23.098 |
| 6,717,051 | B2 * | 4/2004 | Kobayashi | B60R 16/0239 |
| | | | | 361/752 |
| 6,992,382 | B2 * | 1/2006 | Chrysler | H01L 23/473 |
| | | | | 361/689 |
| 6,992,888 | B1 * | 1/2006 | Iyer | H01L 23/3732 |
| | | | | 257/E23.095 |
| 7,317,608 | B2 * | 1/2008 | Omura | H01G 9/10 |
| | | | | 361/502 |
| 7,339,788 | B2 * | 3/2008 | Olesen | F28F 9/0268 |
| | | | | 257/E23.098 |
| 7,561,435 | B2 * | 7/2009 | Kamoshida | H05K 5/062 |
| | | | | 361/728 |
| 7,563,992 | B2 * | 7/2009 | Lawlyes | H05K 9/0073 |
| | | | | 361/747 |
| 7,570,496 | B2 * | 8/2009 | Chen | H05K 5/062 |
| | | | | 361/753 |
| 8,014,150 | B2 * | 9/2011 | Campbell | H05K 7/20809 |
| | | | | 165/185 |
| 8,139,376 | B2 * | 3/2012 | Sanroma | H05K 7/205 |
| | | | | 361/753 |
| 8,305,763 | B2 * | 11/2012 | Kato | H05K 5/006 |
| | | | | 361/752 |
| 8,490,679 | B2 * | 7/2013 | Campbell | F28F 3/12 |
| | | | | 257/714 |
| 8,938,880 | B2 * | 1/2015 | Loong | H01L 23/473 |
| | | | | 29/890.03 |
| 9,013,889 | B2 * | 4/2015 | Tamura | H05K 5/0052 |
| | | | | 361/752 |
| 9,078,367 | B2 * | 7/2015 | Tamura | H05K 5/062 |
| 9,681,580 | B2 * | 6/2017 | Loong | H05K 7/20254 |
| 9,723,740 | B2 * | 8/2017 | Yang | B60R 16/023 |
| 9,730,349 | B2 * | 8/2017 | Nuriya | H05K 5/03 |
| 2005/0180104 | A1 * | 8/2005 | Olesen | H05K 7/20927 |
| | | | | 361/689 |
| 2011/0299265 | A1 | 12/2011 | Nakatsu et al. | |
| 2013/0120943 | A1 * | 5/2013 | Tamura | H05K 5/0039 |
| | | | | 361/752 |
| 2013/0128646 | A1 | 5/2013 | Nishibira et al. | |
| 2017/0257964 | A1 * | 9/2017 | Ishikawa | H05K 5/0047 |
| 2020/0294888 | A1 | 9/2020 | Tsuyuno et al. | |
| 2021/0391236 | A1 * | 12/2021 | Tsuyuno | H01L 23/49562 |

FOREIGN PATENT DOCUMENTS

| | | |
|---|---|---|
| JP | 2012-29539 A | 2/2012 |
| JP | 2017-022374 A | 1/2017 |
| WO | WO 2010/050594 A1 | 5/2010 |
| WO | WO 2019/142545 A1 | 7/2019 |

* cited by examiner

POWER MODULE, POWER CONVERSION DEVICE, AND METHOD FOR MANUFACTURING POWER MODULE

TECHNICAL FIELD

The present invention relates to a power module, a power conversion device, and a method for manufacturing a power module.

BACKGROUND ART

Power conversion devices using switching of power semiconductor elements have high conversion efficiency, and thus, have been widely used for consumer use, automotive use, railway use, substation equipment, and the like. Since this power semiconductor element generates heat due to energization, a power module incorporating the power semiconductor element is required to have high heat dissipation performance. For example, it is required to minimize a gap between a flow passage cover and a heat dissipation fin on an outer periphery of a fin base constituting the power module as much as possible so as to prevent a bypass flow of a refrigerant flowing through the gap. In PTL 1, a seal member, which includes an O-ring portion having an approximately rectangular annular structure and a pair of flow passage control portions integrally formed inside the O-ring portion, is installed in such a gap.

CITATION LIST

Patent Literature

PTL 1: JP 2012-29539 A

SUMMARY OF INVENTION

Technical Problem

In the technique described in PTL 1, high dimensional accuracy is required for a member such as the seal member requires high dimensional accuracy.

Solution to Problem

A power module according to the present invention includes: a fin base on which a plurality of heat dissipation fins are erected; a cover member which forms an inclined portion inclined toward an outer periphery of the fin base and forms a flow passage of a refrigerant with the fin base; and a resin material which bonds the fin base and the cover member to each other, and the resin material is arranged in a first region surrounded by the fin base, the inclined portion of the cover member, and the heat dissipation fin arranged on an outermost peripheral side.

A method for manufacturing a power module according to the present invention includes: a first step of applying a resin material onto a fin base to correspond to an inclined portion of a cover member configured to form a flow passage of a refrigerant with the fin base, the inclined portion being formed in the cover member and inclined toward an outer periphery of the fin base on which a plurality of heat dissipation fins are erected; and a second step of pressing the cover member against the fin base to bond the cover member and the fin base to each other with the resin material interposed between the cover member and the fin base, and the resin material is arranged in a first region surrounded by the fin base, the inclined portion of the cover member, and the heat dissipation fin arranged on an outermost peripheral side.

Advantageous Effects of Invention

According to the present invention, it is possible to provide a power module that prevents a bypass flow of a refrigerant regardless of dimensional accuracy of a member and enhances a cooling effect.

DESCRIPTION OF EMBODIMENTS

Figure 1:
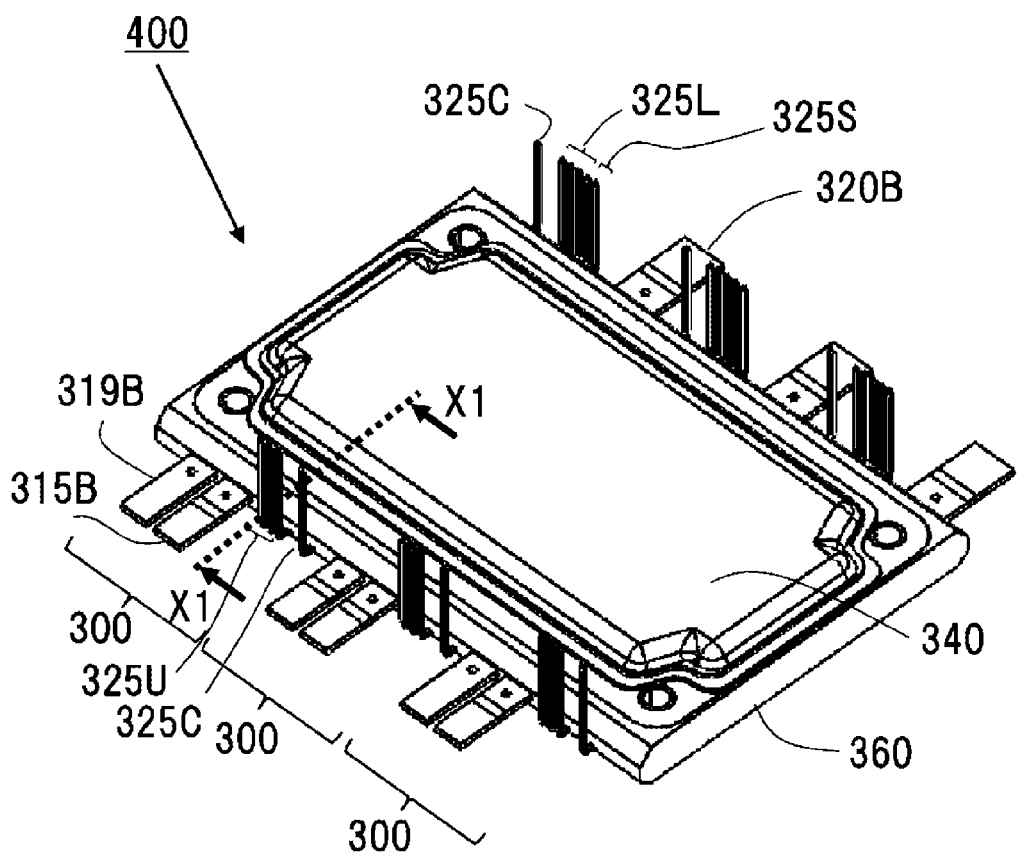
FIG. 1 is a perspective view of a power module according to a first embodiment.

Hereinafter, embodiments of the present invention will be described with reference to the drawings. The following description and drawings are examples given to describe the present invention, and are appropriately omitted and simplified for clarification of the description. The present invention can be implemented in various other forms. Each component may be singular or plural unless specifically limited.

Positions, sizes, shapes, ranges, and the like of the respective components illustrated in the drawings do not always indicate actual positions, sizes, shapes, ranges and the like in order to facilitate understanding of the invention. Therefore, the present invention is not necessarily limited to the positions, sizes, shapes, ranges, and the like disclosed in the drawings.

First Embodiment

FIG. 1 is a perspective view of a power module 400 according to the present embodiment.

The power module 400 incorporates three circuit bodies 300 and is sealed with a sealing resin 360. Each of the circuit bodies 300 includes power terminals through which a large current flows, such as a positive-electrode-side terminal 315B and a negative-electrode-side terminal 319E connected to a capacitor module 600 (see FIG. 13 to be described later) of a DC circuit, and an AC-side terminal 320B connected to motor generators 192 and 194 (see FIG. 13 to be described later) of an AC circuit. In addition, signal terminals, such as a lower arm gate terminal 325L, an upper arm gate terminal 325U, a temperature sense signal terminal 325S, and a collector sense signal terminal 325C, are provided. A circuit configuration of the circuit body 300 will be described later.

The power module 400 includes a cover member 340 that forms a flow passage of a refrigerant with the circuit body 300. The circuit body 300 incorporates a power semiconductor element, performs power conversion using switching of the power semiconductor element, and the power semiconductor element generates heat. The refrigerant flows through the flow passage to cool the heat generation. As the refrigerant, water, antifreeze in which ethylene glycol is mixed with water, or the like is used.

Figure 2:
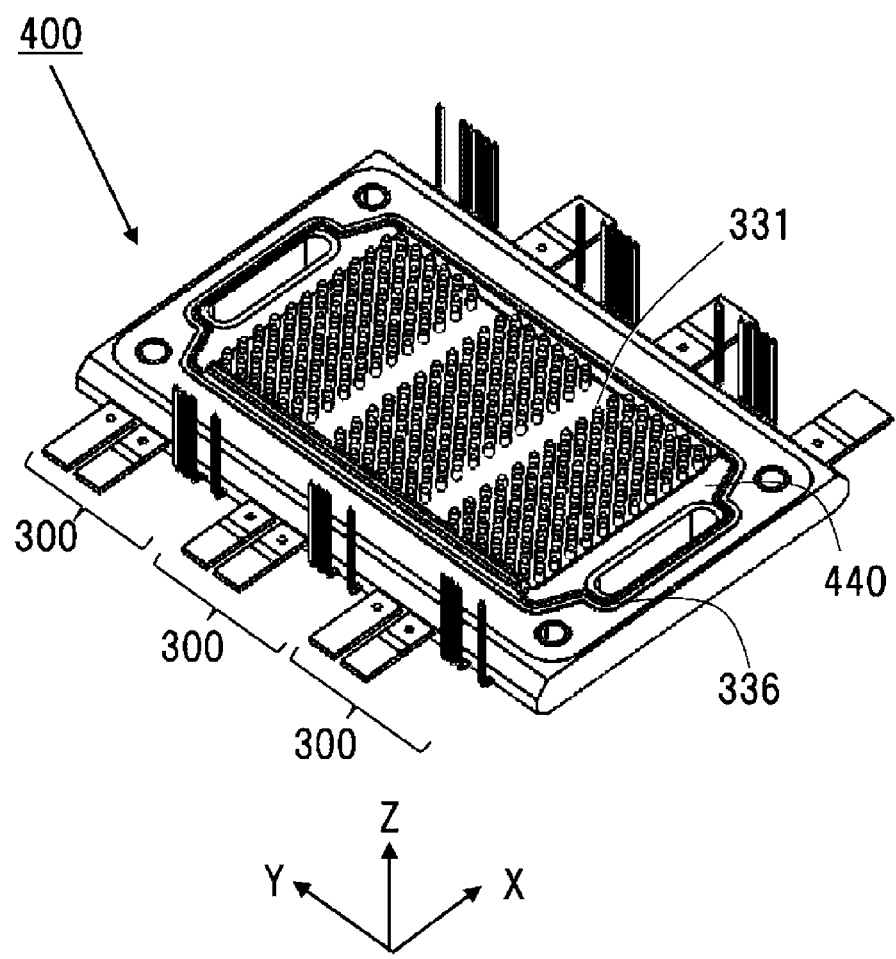
FIG. 2 is a perspective view in which a cover member is hidden from the power module according to the first embodiment.

FIG. 2 is a perspective view in which the cover member 340 is hidden from the power module 400 illustrated in FIG. 1.

A heat dissipation fin 331 is formed on a fin base 440 of the circuit body 300. In addition, a resin material 336 is provided on the fin base 440 on an outer periphery of the fin base 440, and the fin base 440 and the hidden cover member 340 are bonded to each other to form the flow passage of the refrigerant. Although details will be described later, the resin material 336 is provided between the heat dissipation fin 331 arranged on the outermost peripheral side and the cover member 340 on the outer periphery of the fin base 440 and on both sides of the fin base 440 along the Y direction in the drawing. The flow passage is formed on the fin base 440 in the Y direction in the drawing.

Figure 3:
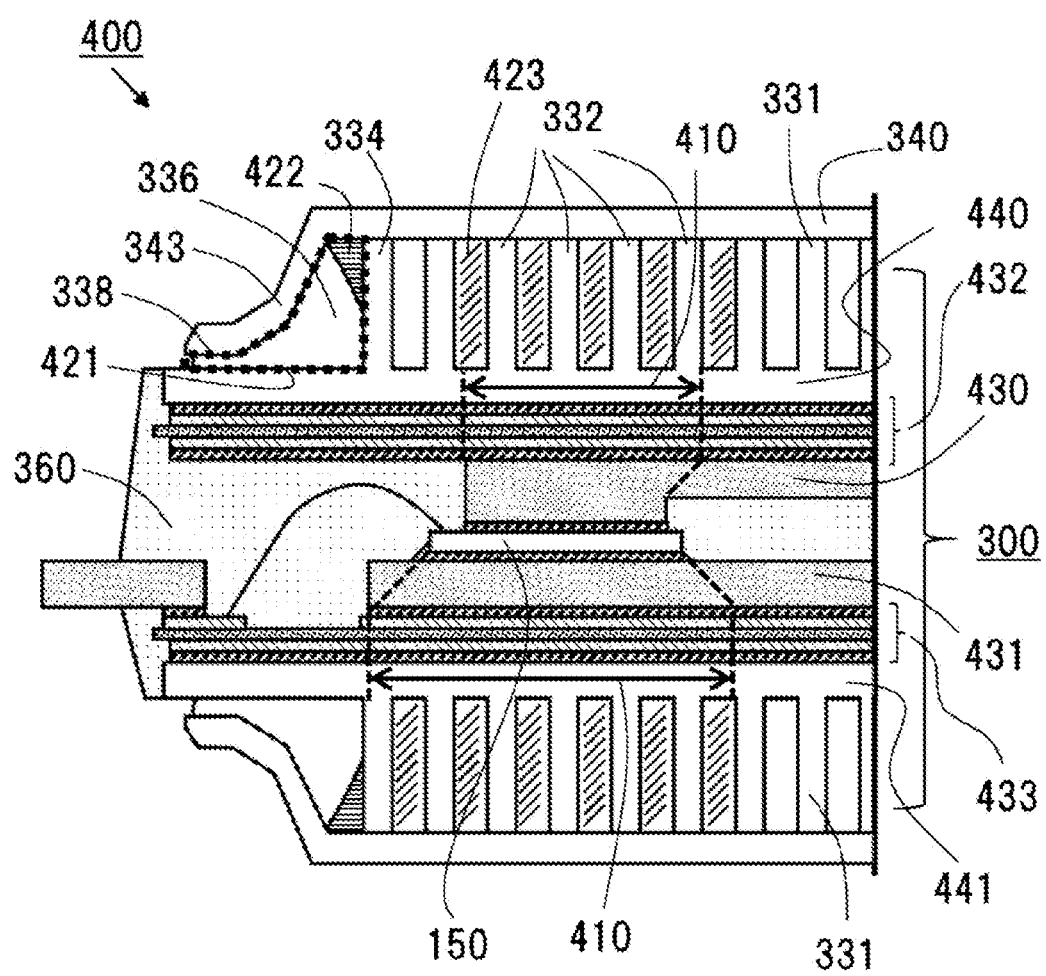
FIG. 3 is a cross-sectional view of the power module according to the first embodiment.

FIG. 3 is a cross-sectional view of the power module 400 according to the present embodiment. FIG. 3 is a cross-sectional view of the power module 400 taken along line X1-X1 illustrated in FIG. 1.

The circuit body 300 includes a collector-side conductor 431 and a collector-side wiring board 433 on a collector side of a power semiconductor element 150, and includes an emitter-side conductor 430 and an emitter-side wiring board 432 on an emitter side. Since the collector-side conductor 431 and the emitter-side conductor 430, which are thick, are provided on sides close to the power semiconductor element 150 of the collector-side wiring board 433 and the emitter-side wiring board 432, respectively, heat of the power semiconductor element 150 is diffused to improve heat dissipation performance. A fin base 441 is bonded to the collector-side wiring board 433, and the fin base 440 is bonded to the emitter-side wiring board 432. The circuit body 300 is sealed with the sealing resin 360. A plurality of the heat dissipation fins 331 are erected on the fin bases 440 and 441.

A region where the heat of the power semiconductor element 150 is diffused at an angle of 45 degrees by the collector-side conductor 431 and the emitter-side conductor 430 is defined as a heat dissipation region 410. The heat dissipation region 410 is a region important for cooling of the power semiconductor element 150. The heat dissipation fins 331 standing upright on the heat dissipation region 410 are referred to as region heat dissipation fins 332. In addition, the heat dissipation fins 331 arranged on the outermost peripheral side of the fin base 440 are defined as outermost peripheral heat dissipation fins 334.

The cover member 340 forms an inclined portion 343 inclined toward the outer periphery of the fin base 440. Then, the cover member 340 and the fin base 440 are bonded to each other at the seal portion 338 with the resin material 336 interposed therebetween. The resin material 336 is arranged in a first region 421 surrounded by the fin base 440, the inclined portion 343 of the cover member 340, and the outermost peripheral heat dissipation fins 334 arranged on the outermost peripheral side. Assuming that the refrigerant flows in the first region 421 on the premise that the resin material 336 is not arranged in the first region 421, the flowing refrigerant becomes a bypass flow that hardly contributes to cooling so that cooling performance deteriorates. In general, the accuracy of the power module 400 is inversely proportional to productivity, and the first region 421 tends to be larger when emphasis is placed on productivity.

In the present embodiment, the resin material 336 is formed to protrude to the first region 421. That is, the resin material 336 is arranged in the first region 421. In a cross section perpendicular to the refrigerant flow direction (Y direction), a cross-sectional area of the first region 421 is larger than an average cross-sectional area 423 of the adjacent heat dissipation fins 331. Then, a cross-sectional area of a second region 422 formed between the resin material 336 arranged in the first region 421 and the outermost peripheral heat dissipation fin 334 arranged on the outermost peripheral side is smaller than the average cross-sectional area 423 of the heat dissipation fins.

That is, the resin material 336 is formed to protrude to the first region 421 to reduce the flow passage of the refrigerant from the first region 421 to the second region 422. When the cross-sectional area of the first region 421 is denoted by C, the cross-sectional area of the second region 422 is denoted by B, and the average fin cross-sectional area is denoted by A, a relationship of $B \ll A < C$ is established. When the cross-sectional area B of the second region 422 that forms the bypass flow is made smaller than the average fin cross-sectional area A in this manner, it is possible to reduce the influence of the bypass flow and improve the heat dissipation performance.

Figure 4:
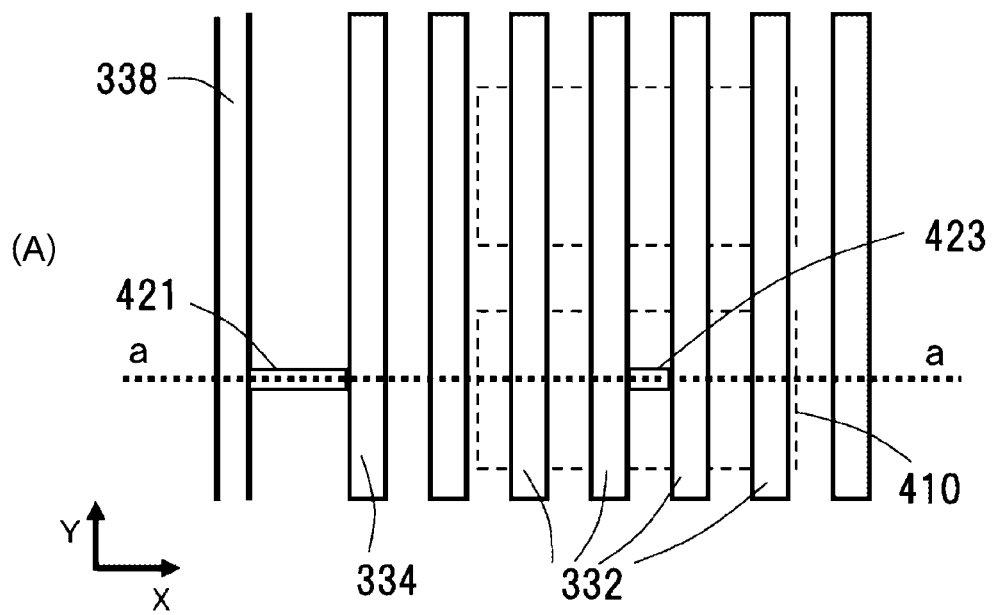
FIGS. 4(A) and 4(B) are plan views in which the cover member is hidden from the power module according to the first embodiment.
Figure 4:
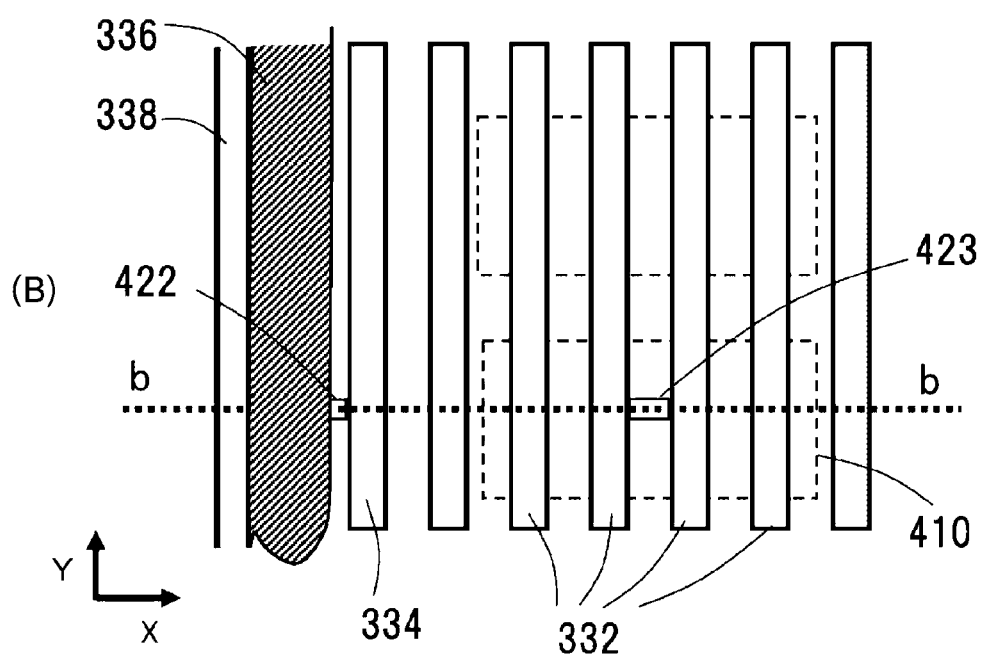

FIG. 4 is a plan view in which the cover member 340 is hidden from the power module 400, and illustrates a case where the heat dissipation fin 331 is a straight fin. FIG. 4(A) illustrates a case where the resin material 336 is not arranged in the first region 421, and FIG. 4(B) illustrates a case where the resin material 336 is arranged in the first region 421.

In the case where the resin material 336 is not arranged in the first region 421 as illustrated in FIG. 4(A), the cross section of the first region 421 is larger than the average cross-sectional area 423 of the heat dissipation fins when observed along dotted line a-a in the X direction. The refrigerant flowing in the Y direction in the first region 421 is more than the refrigerant flowing in the average cross-sectional area 423 of the heat dissipation fins. Therefore, the refrigerant flows in the first region 421, and forms the bypass flow that hardly contributes to cooling, so that the cooling performance deteriorates.

In the case of the present embodiment in which the resin material 336 is arranged in the first region 421 as illustrated in FIG. 4(B), the cross section of the second region 422 is smaller than the average cross-sectional area 423 of the heat dissipation fins when observed along dotted line b-b in the X direction. The refrigerant flowing in the Y direction in the second region 422 is less than the refrigerant flowing in the average cross-sectional area 423 of the heat dissipation fins. Therefore, the influence of the bypass flow flowing in the second region 422 can be reduced, and the heat dissipation performance can be improved. Note that it is desirable to reduce the bypass flow flowing in the second region 422 as much as possible.

The resin material 336 is an adhesive material using an aluminum (Al) plate as an adherend, and is a material in which cohesive failure occurs in 80% or more of an area when a test piece for determining tensile lap-shear strength conforming to JIS K 6850 is immersed in a long life coolant at 125° C. for 2000 hours in a sealed container and then subjected to a tensile test.

Figure 5:
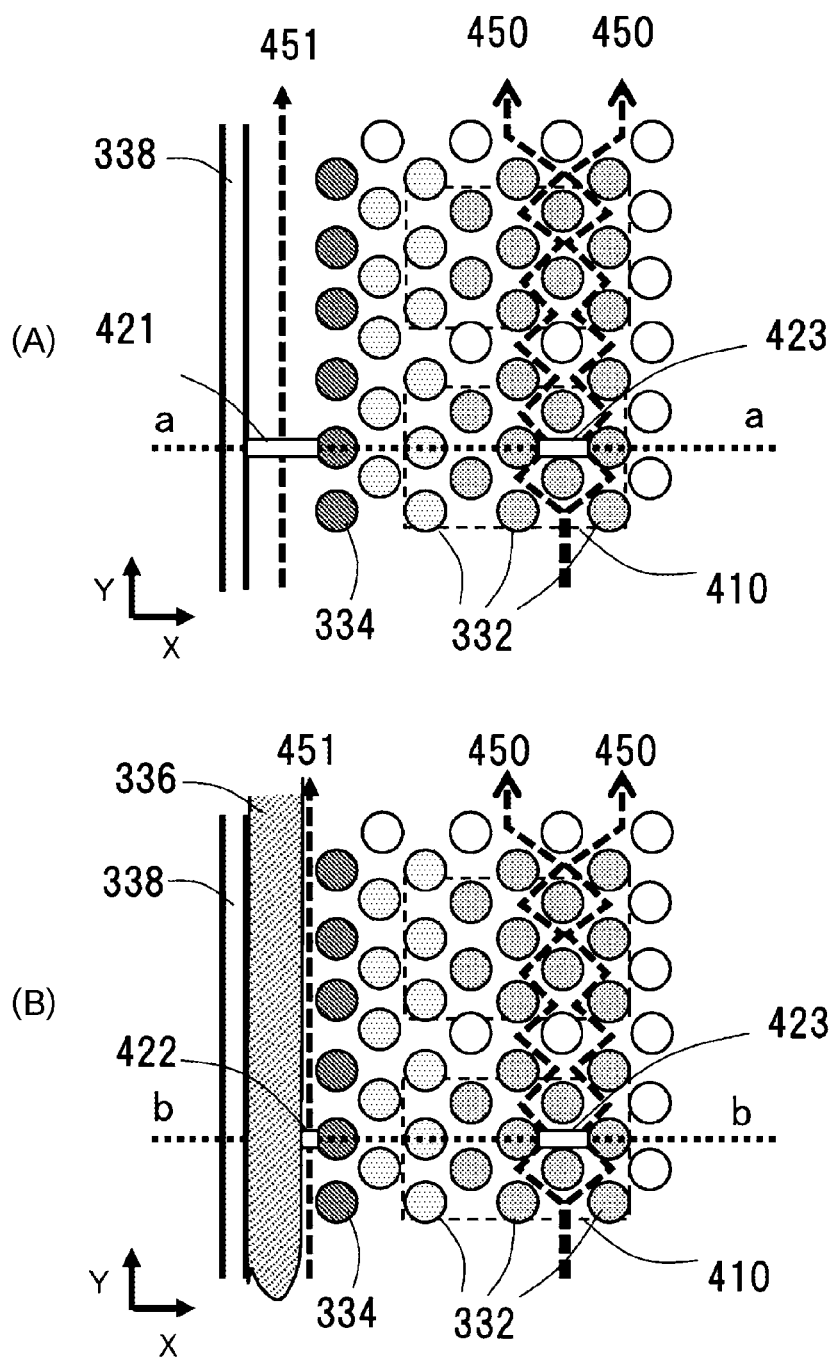
FIGS. 5(A) and 5(B) are plan views in which the cover member is hidden from the power module according to the first embodiment.

FIG. 5 is a plan view in which the cover member 340 is hidden from the power module 400, and illustrates a case where the heat dissipation fin 331 is a pin fin. FIG. 5(A) illustrates a case where the resin material 336 is not arranged in the first region 421, and FIG. 5(B) illustrates a case where the resin material 336 is arranged in the first region 421.

In the case where the resin material 336 is not arranged in the first region 421 as illustrated in FIG. 5(A), the cross section of the first region 421 is larger than the average cross-sectional area 423 of the heat dissipation fins when observed along dotted line a-a in the X direction. Out of the refrigerant flowing in the Y direction, a refrigerant 451 flowing in the first region 421 is larger than a refrigerant 450 flowing in the average cross-sectional area 423 of the heat dissipation fins. Therefore, the refrigerant flows in the first region 421, and forms the bypass flow that hardly contributes to cooling, so that the cooling performance deteriorates.

In the case of the present embodiment in which the resin material 336 is arranged in the first region 421 as illustrated in FIG. 5(B), the cross section of the second region 422 is smaller than the average cross-sectional area 423 of the heat dissipation fins when observed along dotted line b-b in the X direction. Out of the refrigerant flowing in the Y direction, the refrigerant 451 flowing in the second region 422 is smaller than the refrigerant 450 flowing in the average cross-sectional area 423 of the heat dissipation fins. Therefore, the influence of the bypass flow flowing in the second region 422 can be reduced, and the heat dissipation performance can be improved. Note that it is desirable to reduce the bypass flow flowing in the second region 422 as much as possible.

Figure 6:
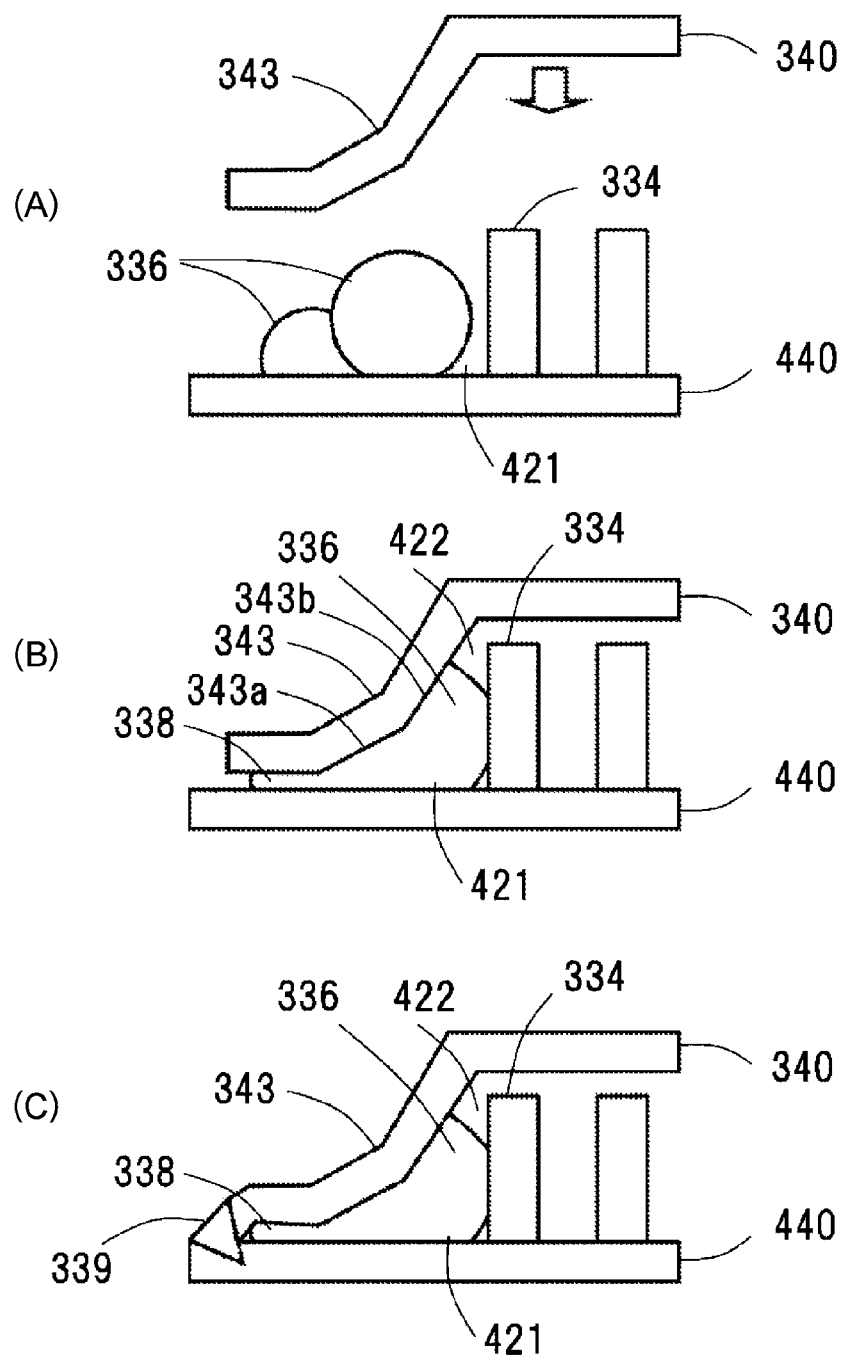
FIGS. 6(A), 6(B), and 6(C) are views illustrating a method for manufacturing the power module according to the first embodiment.

FIG. 6 is a view illustrating a method for manufacturing the power module 400, and FIGS. 6(A), 6(B), and 6(C) are views illustrating a first step, a second step, and a third step, respectively.

In the first step illustrated in FIG. 6(A), the resin material 336 in a liquid state is applied onto the fin base 440. A position where the resin material 336 is applied is a position corresponding to the inclined portion 343 of the cover member 340, and is the first region 421 surrounded by the outermost peripheral heat dissipation fins 334 arranged on the outermost peripheral side and the inclined portion 343. When the resin material 336 is applied, the first region 421 can be effectively filled with the resin material 336 by separately applying appropriate amounts of the resin material 336 to form the seal portion 338 and the resin material 336 to protrude to suppress the bypass flow, and desirably, the second region 422 can be eliminated.

In the second step illustrated in FIG. 6(B), the cover member 340 and the fin base 440 are bonded to each other.

Specifically, the cover member 340 is pressed against the fin base 440 to stretch the resin material 336 toward the outermost peripheral heat dissipation fin 334 and the seal portion 338, and thereafter, the resin material 336 is cured by heating or the like. As a result, the resin material 336 is arranged in the first region 421 surrounded by the fin base 440, the inclined portion 343 of the cover member 340, and the outermost peripheral heat dissipation fins 334 arranged on the outermost peripheral side. Note that the inclined portion 343 has a first inclined portion 343a directed to the outer peripheral side of the fin base 440 and a second inclined portion 343b directed to the heat dissipation fin side, and an angle of the second inclined portion 343b with respect to the fin base 440 is larger than that of the first inclined portion 343a. Therefore, when the cover member 340 is pressed against the fin base 440, the resin material 336 is pushed out toward the outermost peripheral heat dissipation fin 334 by the second inclined portion 343b, so that the second region 422 can be narrowed, and desirably eliminated. The resin material 336 adheres to the first inclined portion 343a and adheres to at least a part of the second inclined portion 343b. Then, the cover member 340 and the fin base 440 are bonded to each other by the resin material 336 at the seal portion 338. Although the cover member 340 and the fin base 440 can be bonded by the resin material 336, the following third step is performed as necessary.

In the third step illustrated in FIG. 6(C), the cover member 340 and the fin base 440 are fixed. Specifically, the cover member 340 and the fin base 440 are fixed at a welded portion 339 by laser welding or the like in an outer peripheral portion of the cover member 340.

Second Embodiment

Figure 7:
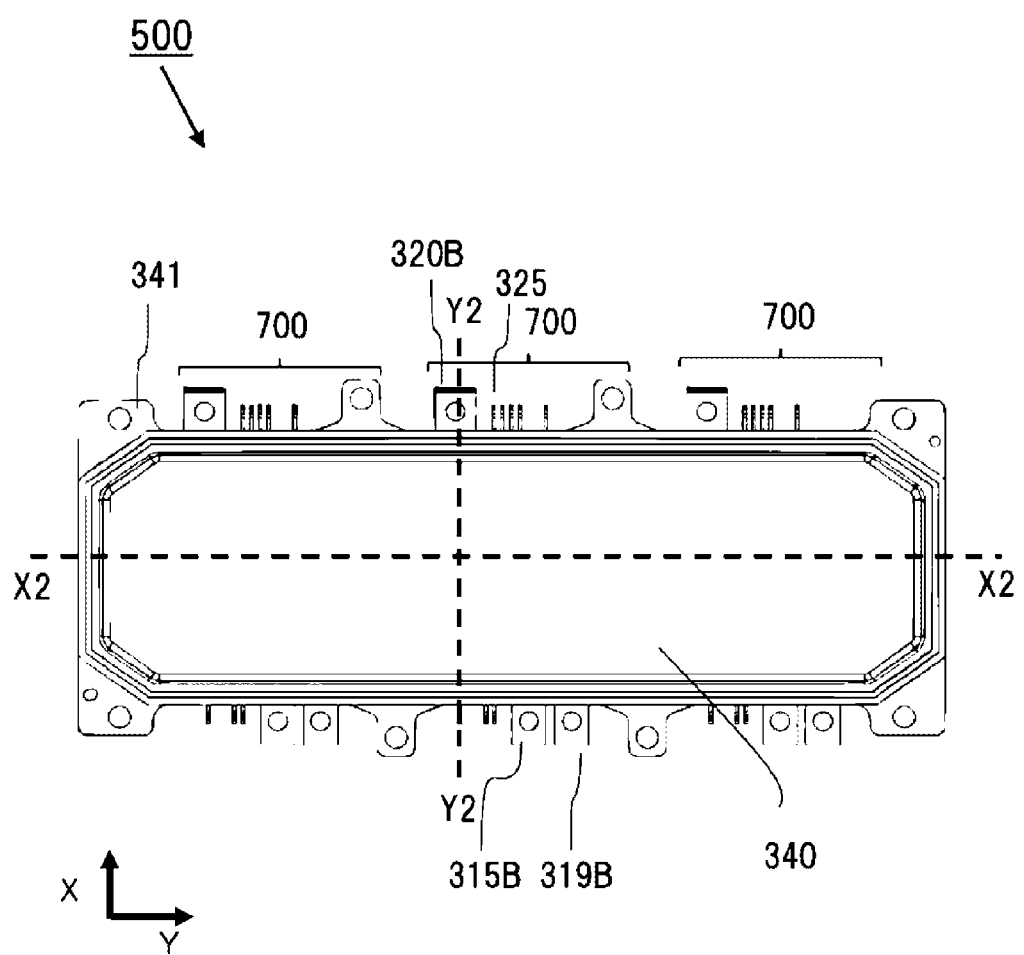
FIG. 7 is a top view of a power module according to a second embodiment.

FIG. 7 is a top view of a power module 500 according to the present embodiment.

The power module 500 includes three circuit bodies 700, connecting members 341 that connect the three circuit bodies 700, and the cover member 340 that forms a flow passage of a refrigerant with the connected circuit bodies 700. The circuit body 700 incorporates a power semiconductor element, performs power conversion using switching of the power semiconductor element, and the power semiconductor element generates heat. The power module 500 has a structure in which the refrigerant is caused to flow through the flow passage in the Y direction to perform cooling. As the refrigerant, water, antifreeze in which ethylene glycol is mixed with water, or the like is used.

The circuit body 700 includes power terminals through which a large current flows, such as the positive-electrode-side terminal 315B and the negative-electrode-side terminal 319B connected to the capacitor module 600 (see FIG. 13 to be described later) of a DC circuit, and the AC-side terminal 320B connected to the motor generators 192 and 194 (see FIG. 13 to be described later) of an AC circuit. In addition, signal terminals 325 such as a lower arm gate terminal, a mirror emitter signal terminal, a Kelvin emitter signal terminal, a collector sense signal terminal, an upper arm gate terminal, and a temperature sense signal terminal, are provided.

Figure 8:
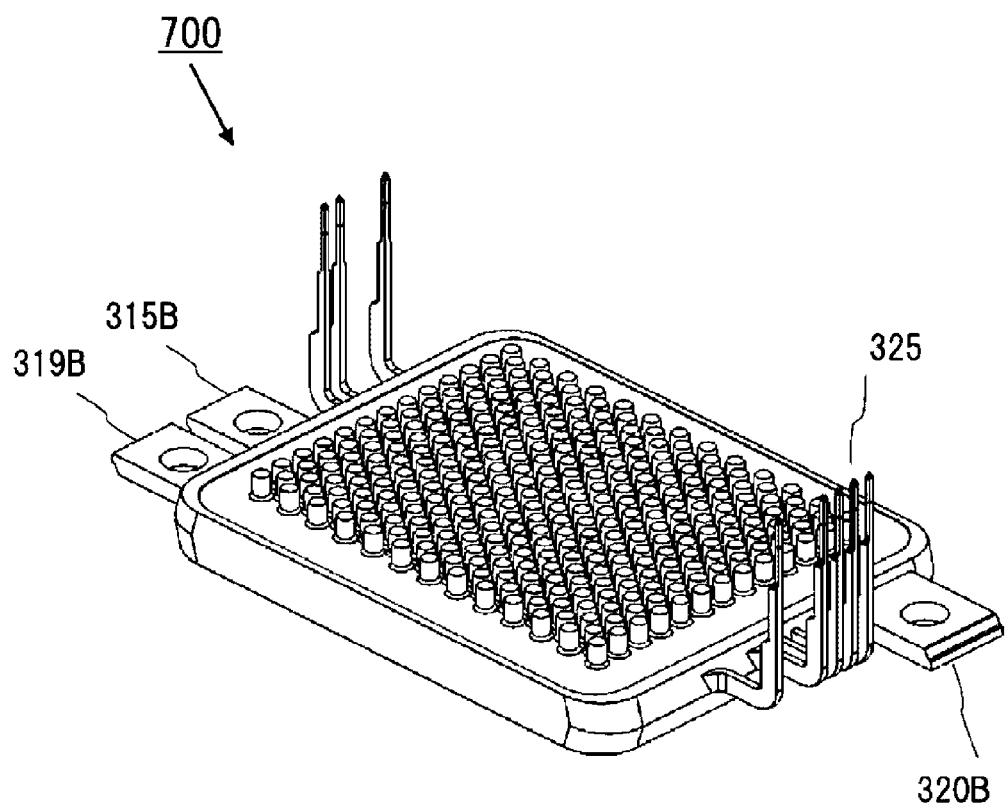
FIG. 8 is an external perspective view of a circuit body according to the second embodiment.

FIG. 8 is an external perspective view of the circuit body 700 according to the present embodiment.

As illustrated in FIG. 8, the circuit body 700 incorporates a power semiconductor element having a power conversion function and is sealed with resin, and the positive-electrode-side terminal 315B, the negative-electrode-side terminal 319B, the AC-side terminal 320B, the signal terminal 325, and the like are led out therefrom. The power module 500 has a configuration in which the three circuit bodies 700 are connected by the connecting members 341 and covered by the cover member 340.

Figure 9:
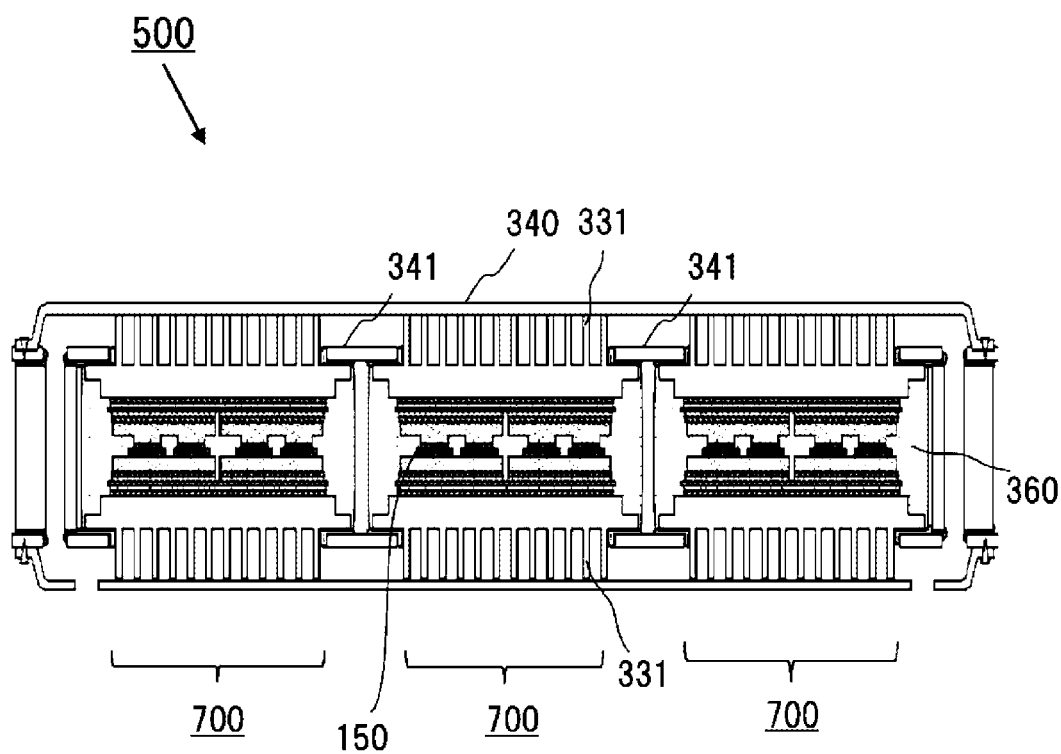
FIG. 9 is a cross-sectional view of the power module according to the second embodiment.
Figure 10:
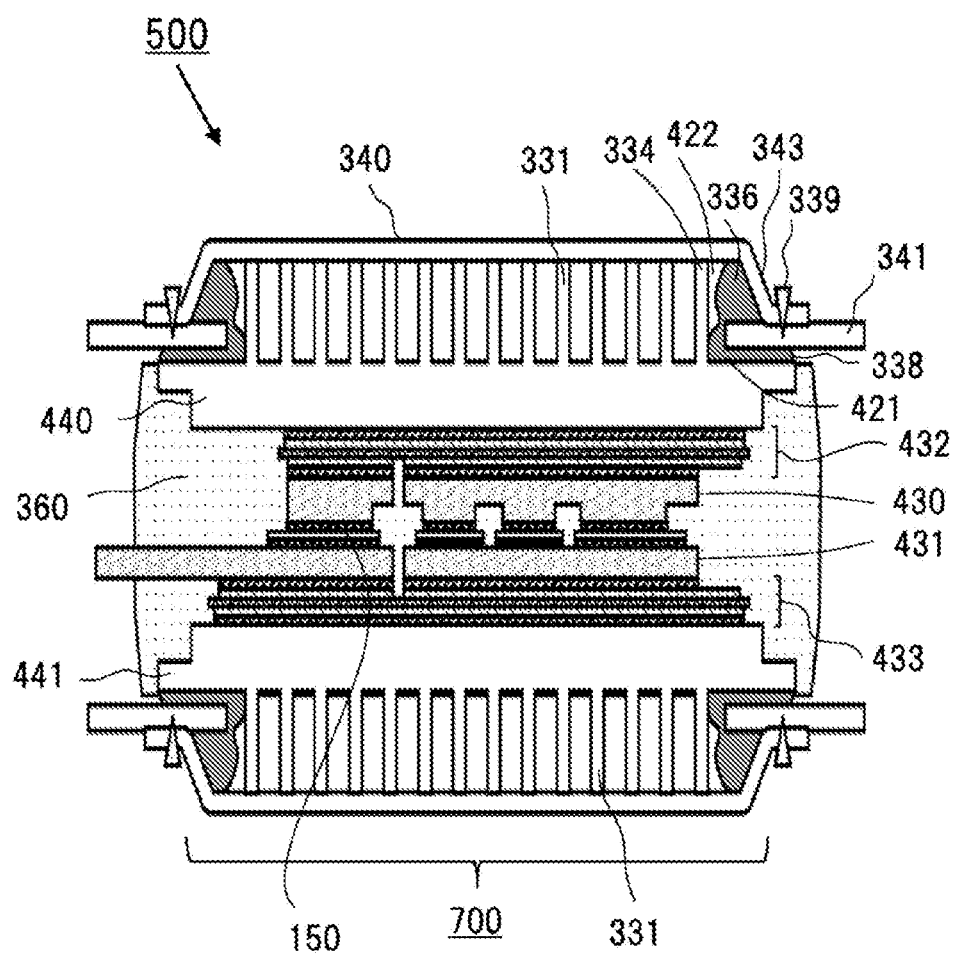
FIG. 10 is a cross-sectional view of the power module according to the second embodiment.

FIG. 9 is a cross-sectional view of the power module 500 according to the present embodiment, and FIG. 9 is the cross-sectional view of the power module 500 taken along line X2-X2 illustrated in FIG. 7. FIG. 10 is a cross-sectional view of the power module 500, and FIG. 10 is the cross-sectional view of the power module 500 taken along line Y2-Y2 illustrated in FIG. 7.

As illustrated in FIG. 9, the three circuit bodies 700 are connected by the connecting members 341 in the power module 500. Then, the cover member 340 that forms the flow passage of the refrigerant with the connected circuit bodies 700 is provided. The circuit body 700 incorporates the power semiconductor element 150, and further, includes the collector-side conductor 431 and the collector-side wiring board 433 on the collector side of the power semiconductor element 150, and includes the emitter-side conductor 430 and the emitter-side wiring board 432 on the emitter side as illustrated in FIG. 10. A fin base 441 is bonded to the collector-side wiring board 433, and the fin base 440 is bonded to the emitter-side wiring board 432. The circuit body 700 is sealed with the sealing resin 360. A plurality of the heat dissipation fins 331 are erected on the fin bases 440 and 441.

The cover member 340 forms an inclined portion 343 inclined toward the outer periphery of the fin base 440. Then, the connecting member 341 and the fin base 440 are bonded to each other at the seal portion 338 with the resin material 336 interposed therebetween. Further, the cover member 340 and the connecting member 341 are bonded to each other at the seal portion 338 with the resin material 336 interposed therebetween, and are laser-welded at the welded portion 339. The resin material 336 is arranged in the first region 421 surrounded by the fin base 440, the inclined portion 343 of the cover member 340, the outermost peripheral heat dissipation fins 334 arranged on the outermost peripheral side, and the connecting member 341.

In the present embodiment, the resin material 336 is formed to protrude to the first region 421. That is, the resin material 336 is arranged in the first region 421. In a cross section perpendicular to the refrigerant flow direction (Y direction), a cross-sectional area of the first region 421 is larger than an average cross-sectional area 423 of the adjacent heat dissipation fins 331. Then, a cross-sectional area of a second region 422 formed between the resin material 336 arranged in the first region 421 and the outermost peripheral heat dissipation fin 334 arranged on the outermost peripheral side is smaller than the average cross-sectional area 423 of the heat dissipation fins.

That is, the resin material 336 is formed to protrude to the first region 421 to reduce the flow passage of the refrigerant from the first region 421 to the second region 422. When the cross-sectional area of the first region 421 is denoted by C, the cross-sectional area of the second region 422 is denoted by B, and the average fin cross-sectional area is denoted by A, a relationship of B<<A<C is established. When the cross-sectional area B of the second region 422 that forms the bypass flow is made smaller than the average fin cross-sectional area A in this manner, it is possible to reduce the influence of the bypass flow and improve the heat dissipation performance.

The resin material 336 is an adhesive material using an aluminum (Al) plate as an adherend, and is a material in which cohesive failure occurs in 80% or more of an area when a test piece for determining tensile-shear strength conforming to JIS K 6850 is immersed in a long life coolant at 125° C. for 2000 hours in a sealed container and then subjected to a tensile test.

The fin base 440 is a pure aluminum member, and the connecting member 341 and the cover member 340 are made of an alloy aluminum material. Specifically, the connecting member 341 and the cover member 340 are made of a 3000-series aluminum material.

Figure 11:
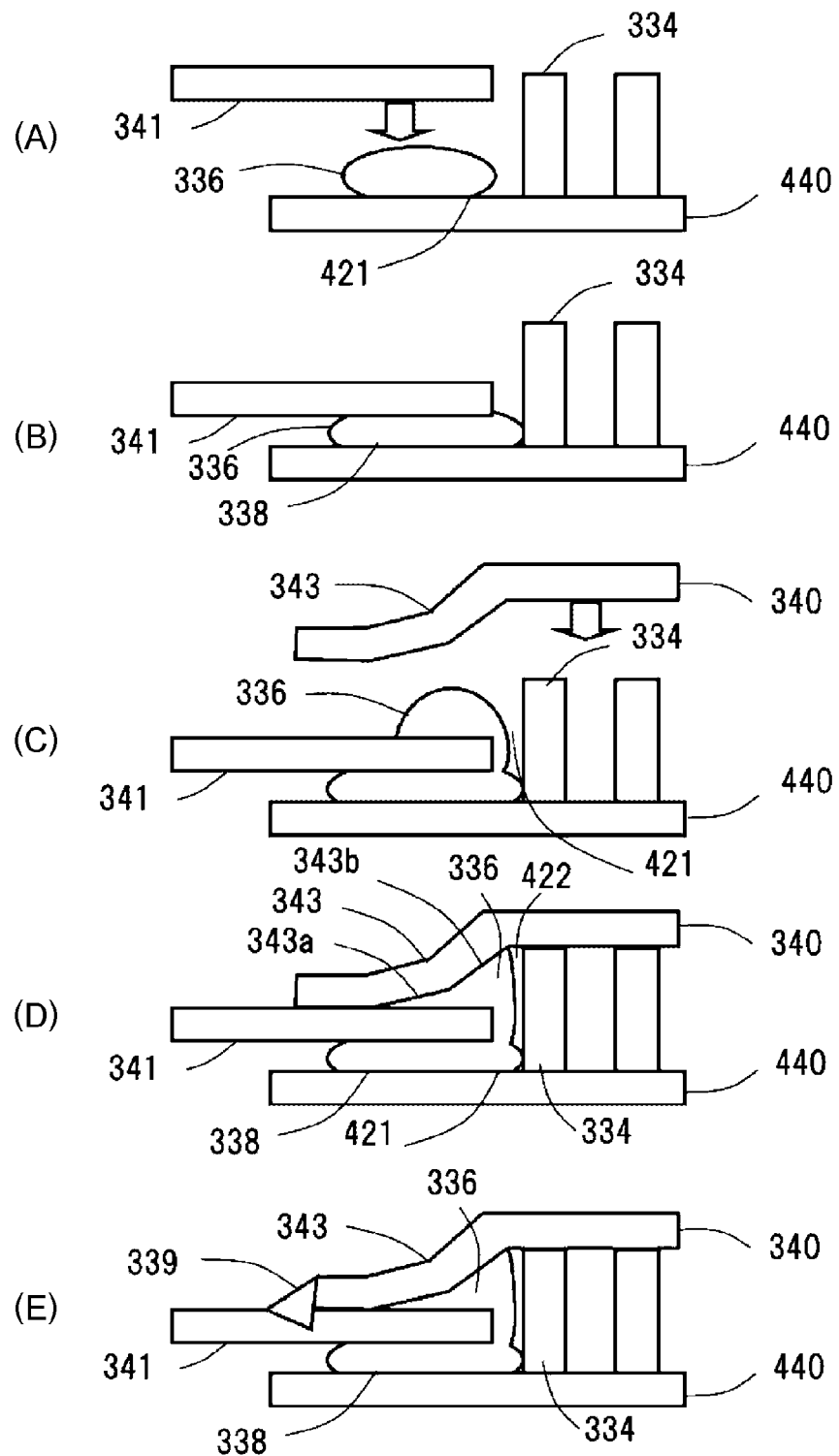
FIGS. 11(A), 11(B), 11(C), 11(D), and 11(E) are views illustrating a method for manufacturing the power module according to the second embodiment.

FIG. is a view illustrating a method for manufacturing the power module 500, FIG. 11(A) is a view illustrating a first step, FIG. 11(B) is a view illustrating a second step, FIG. 11(C) is a view illustrating a third step, FIG. 11(D) is a view illustrating a fourth step, FIG. 11(D) is the view illustrating a fifth step, and FIG. 11(E) is a view illustrating a sixth step.

In the first step illustrated in FIG. 11(A), the resin material 336 in a liquid state is applied onto the fin base 440. A position where the resin material 336 is applied is a position to which the connecting member 341 is bonded, a position corresponding to the inclined portion 343 (see FIG. 11(C)) of the cover member 340, and is the first region 421 surrounded by the outermost peripheral heat dissipation fins 334 arranged on the outermost peripheral side and the inclined portion 343. The resin material 336 is applied in an amount required for adhesion to the connecting member 341.

In the second step illustrated in FIG. 11(B), the connecting member 341 and the fin base 440 are bonded to each other. Specifically, the connecting member 341 is pressed against the fin base 440 to stretch the resin material 336 toward the outermost peripheral heat dissipation fin 334 and the seal portion 338.

In the third step illustrated in FIG. 11(C), the resin material 336 in a liquid state is applied to a side closer to the outermost peripheral heat dissipation fin 334 on the connecting member 341. A position where the resin material 336 is applied is a position corresponding to the inclined portion 343 of the cover member 340, and is the first region 421 surrounded by the outermost peripheral heat dissipation fins 334 arranged on the outermost peripheral side and the inclined portion 343. The resin material 336 is applied in an amount required to protrude from the connecting member 341 to the first region 421 on the upper side.

In the fourth step illustrated in FIG. 11(D), the cover member 340 and the connecting member 341 are bonded to each other.

Specifically, the cover member 340 is pressed against the connecting member 341 to stretch the resin material 336 toward the outermost peripheral heat dissipation fin 334 and the seal portion 338, and thereafter, the resin material 336 is cured by heating or the like. As a result, the resin material 336 is arranged in the first region 421 surrounded by the connecting member 341, the inclined portion 343 of the cover member 340, and the outermost peripheral heat dissipation fins 334 arranged on the outermost peripheral side. Note that the inclined portion 343 has a first inclined portion 343a directed to the outer peripheral side of the fin base 440 and a second inclined portion 343b directed to the heat dissipation fin side, and an angle of the second inclined portion 343b with respect to the fin base 440 is larger than that of the first inclined portion 343a. Therefore, when the cover member 340 is pressed against the fin base 440 and the connecting member 341, the resin material 336 is pushed out toward the outermost peripheral heat dissipation fin 334 by the second inclined portion 343b, so that the second region 422 can be narrowed, and desirably eliminated. Then, the cover member 340 and the connecting member 341 are bonded to each other by the resin material 336. Although the cover member 340 and the connecting member 341 can be bonded by the resin material 336, the following fifth step is performed as necessary.

In the fifth step illustrated in FIG. 11(E), the cover member 340 and the connecting member 341 are fixed.

Specifically, the cover member 340 and the connecting member 341 are fixed at the welded portion 339 by laser welding or the like in the outer peripheral portion of the cover member 340.

Hereinafter, a device to which the power modules 400 and 500 described in the first embodiment and the second embodiment are applied will be described.

Figure 12:
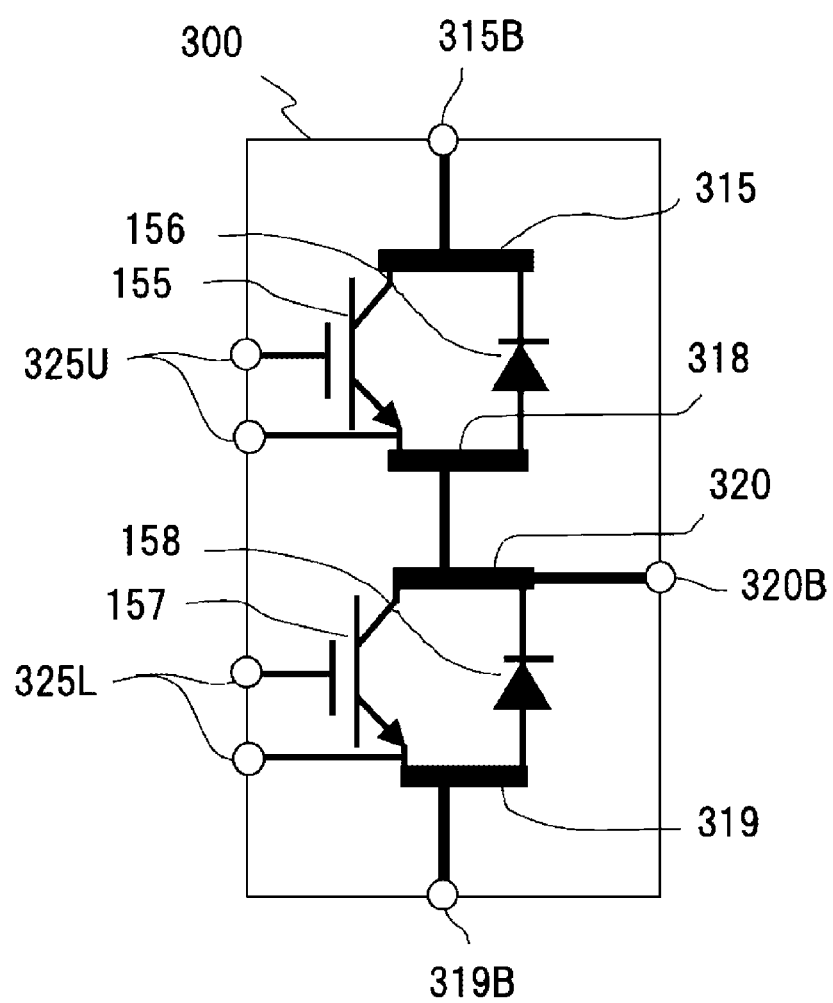
FIG. 12 is a circuit configuration diagram of the circuit body.

FIG. 12 is a circuit configuration diagram of the circuit body 300.

Each of the power modules 400 and 500 includes the three circuit bodies 300, and performs power conversion between DC power and AC power. As illustrated in FIG. 12, for example, upper and lower arm series circuits in each phase of U, V, and W phases include a power semiconductor element 155 and a diode 156 of the upper arm and a power semiconductor element 157 and a diode 158 of the lower arm. Cathode electrodes and anode electrodes of the diodes 156 and 158 are electrically connected to collector electrodes of the power semiconductor elements 155 and 157 and emitter electrodes of the power semiconductor elements 155 and 157, respectively. As a result, a current flows in the forward direction from the emitter electrode to the collector electrode in the power semiconductor element 155 of the upper arm and the power semiconductor element 157 of the lower arm. The power semiconductor elements 155 and 157 are, for example, power metal oxide semiconductor field effect transistors (MOSFETs), insulated gate bipolar transistors (IGBTs), or the like.

The positive-electrode-side terminal 315B and the upper arm gate terminal 325U are led out from the power semiconductor element 155 and the diode 156 of the upper arm. The negative-electrode-side terminal 319B and the lower arm gate terminal 325L are led out from the power semiconductor element 157 and the diode 158 of the lower arm. The AC-side terminal 320E is led out from a midpoint between the upper arm and the lower arm.

Figure 13:
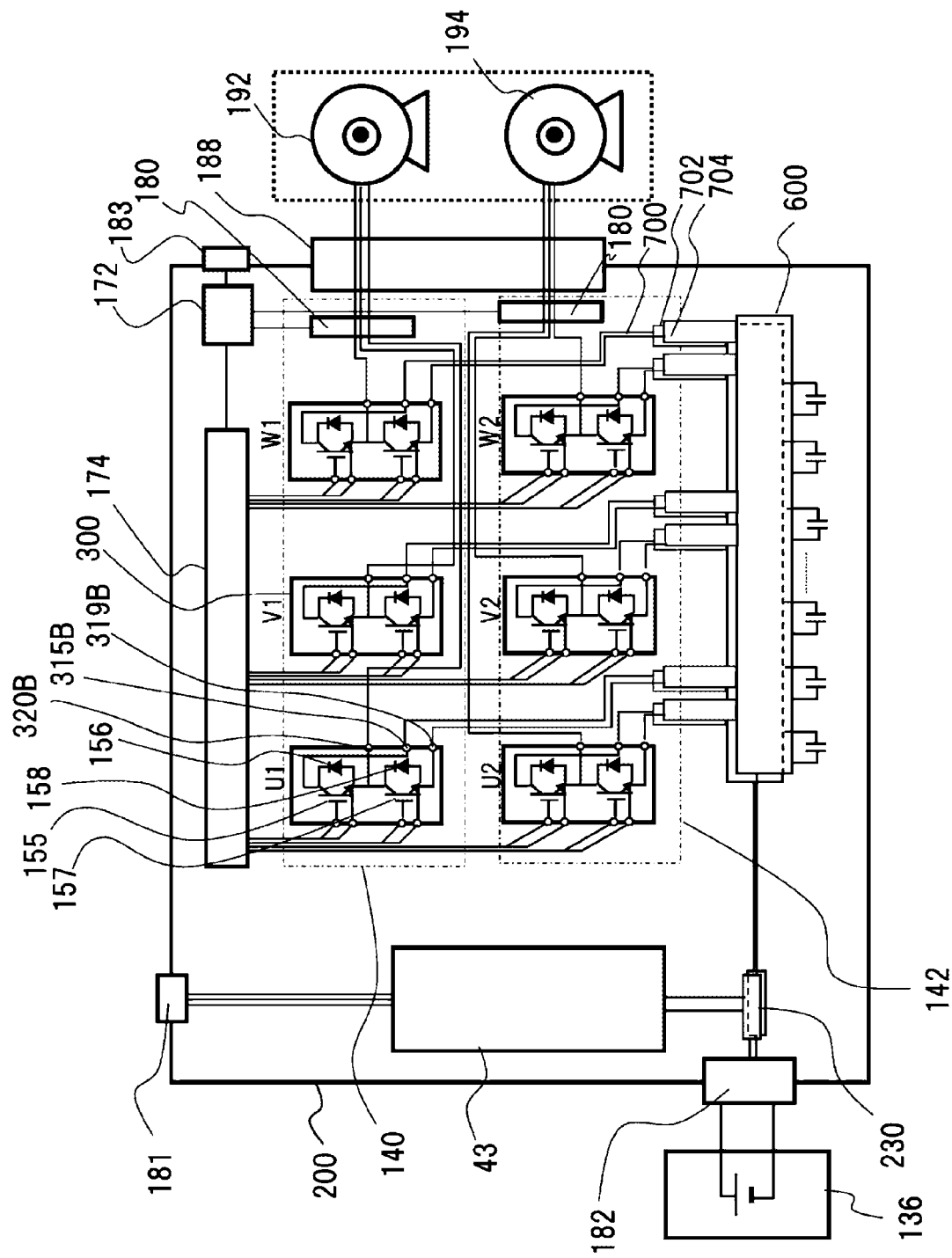
FIG. 13 is a circuit configuration diagram of a power conversion device to which the power module is applied.

FIG. 13 is a circuit configuration diagram of a power conversion device 200 to which the power modules 400 and 500 are applied.

The power conversion device 200 includes inverter circuits 140 and 142, an auxiliary inverter circuit 43, and a capacitor module 600. The inverter circuits 140 and 142 include the power modules 400 and 500 each including the plurality of circuit bodies 300.

Then, the power modules 400 and 500 are connected to form a three-phase bridge circuit. That is, the power conversion device 200 includes the power modules 400 and 500, and performs mutual conversion between DC power and AC power. In a case where current capacity is large, it is possible to cope with the increase in current capacity by further connecting the circuit body 300 in parallel and making the parallel connection so as to correspond to each phase of a three-phase inverter circuit. In addition, it is also possible to cope with the increase in current capacity by connecting the power semiconductor elements 155 and 157 or the diodes 156 and 158 incorporated in the circuit bodies 300 in parallel.

The inverter circuit 140 and the inverter circuit 142 have the same basic circuit configuration, and basically have the same control method and operation. Since a circuit operation of the inverter circuit 140 and the like is well known, the description thereof will be omitted.

The power semiconductor elements 155 and 157 perform a switching operation in response to a drive signal output from one or the other of two driver circuits constituting a driver circuit 174, and convert DC power supplied from a battery 136 into three-phase AC power.

The positive-electrode-side terminal 315B and the negative-electrode-side terminal 319B of the upper and lower arm series circuits are connected to capacitor connection terminals of the capacitor module 600, respectively. The AC power is generated at each connection portion between the upper arm circuit and the lower arm circuit, and the connection portion between the upper arm circuit and the lower arm circuit of the upper and lower arm series circuits is connected to the AC-side terminal 320B of each of the circuit bodies 300. The AC-side terminal 320B of each of the circuit bodies 300 of each phase is connected to an output terminal of the power conversion device 200, and the generated AC power is supplied to a stator winding of the motor generator 192 or 194.

A control circuit 172 generates a timing signal for controlling the switching operation of the power semiconductor element 155 of the upper arm and the power semiconductor element 157 of the lower arm based on input information from a control device, a sensor (for example, a current sensor 180), or the like on a vehicle side. The driver circuit 174 generates a drive signal for switching the power semiconductor element 155 of the upper arm and the power semiconductor element 157 of the lower arm based on the timing signal output from the control circuit 172. Note that reference signs 181, 182, 183, and 188 denote connectors.

The upper and lower arm series circuits include a temperature sensor (not illustrated), and temperature information of the upper and lower arm series circuits is input to the control circuit 172. In addition, voltage information on the DC positive electrode side of the upper and lower arm series circuits is input to the control circuit 172. The control circuit 172 performs overtemperature detection and overvoltage detection based on these pieces of information, stops the switching operation of all the power semiconductor elements 155 of the upper arm and the power semiconductor elements 157 of the lower arm when overtemperature or overvoltage is detected, and protects the upper and lower arm series circuits from overtemperature or overvoltage.

Figure 14:
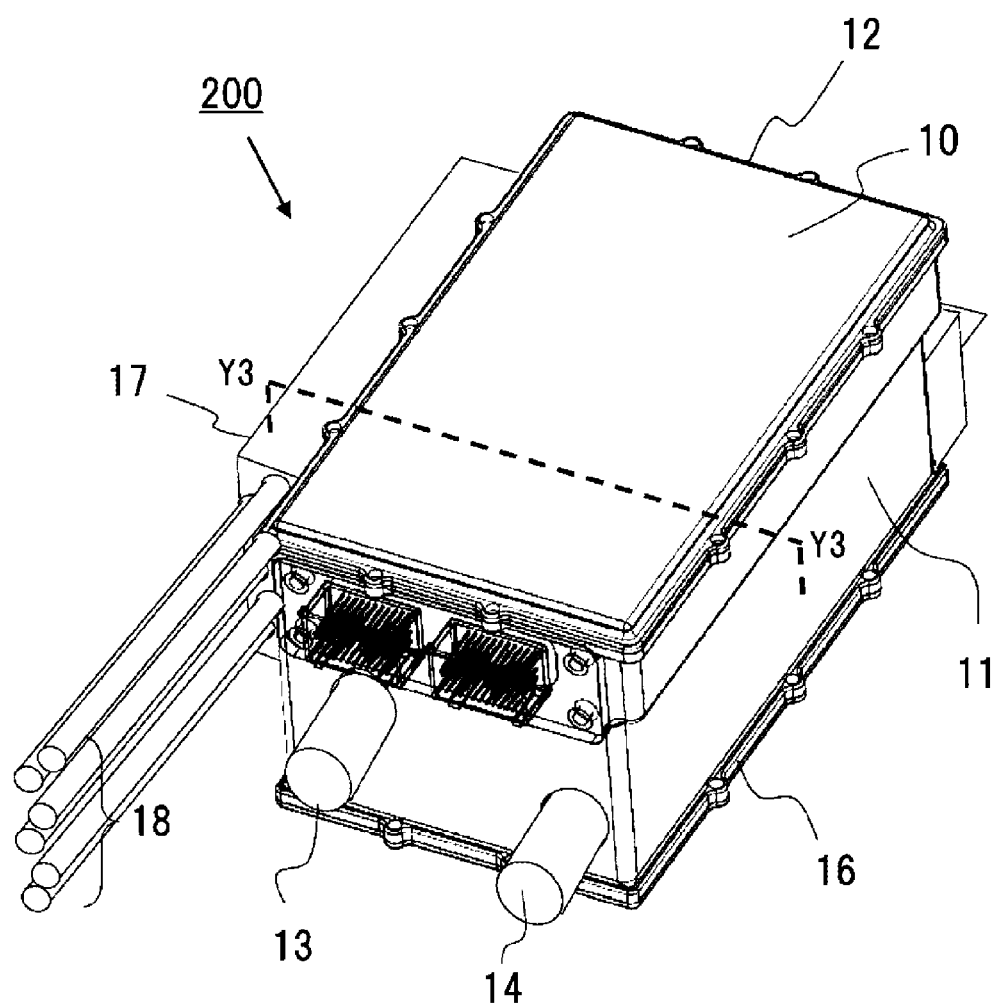
FIG. 14 is an external perspective view of the power conversion device.
Figure 15:
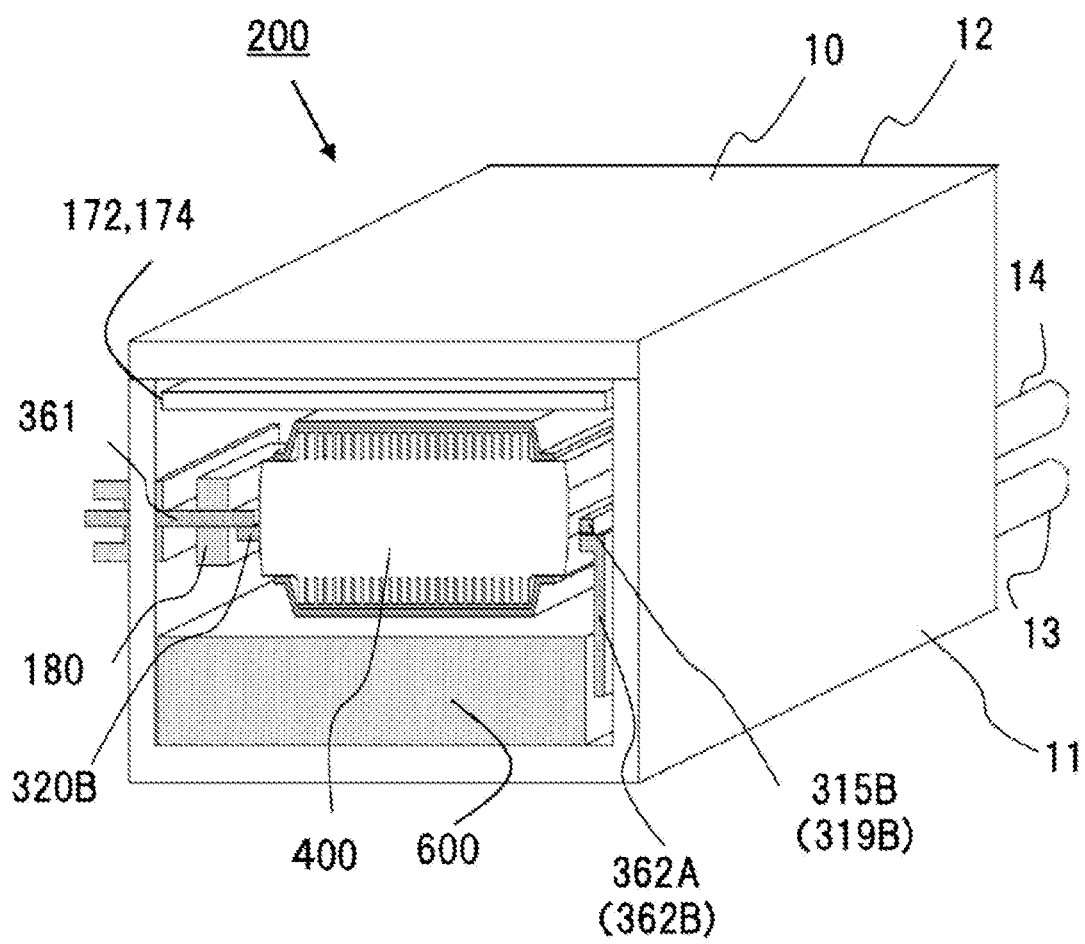
FIG. 15 is a cross-sectional view of the power conversion device.

FIG. 14 is an external perspective view of the power conversion device 200. FIG. 15 is a cross-sectional view taken along line Y3-Y3 of the power conversion device 200 illustrated in FIG. 14.

The power conversion device 200 includes a casing 12 that is constituted by a lower case 11 and an upper case 10 and is formed in a substantially rectangular parallelepiped shape. The power module 400 and the like are accommodated in the casing 12. The power module 400 has the flow passage of the refrigerant, and an inflow pipe 13 and an outflow pipe 14 communicating with the flow passage protrude from one side surface of the casing 12. As illustrated in FIG. 15, the lower case 11 has an opening on the upper side (in the Z direction), and the upper case 10 is attached to the lower case 11 by closing the opening of the lower case 11. The upper case 10 and the lower case 11 are made of an aluminum alloy or the like, and are hermetically sealed from the outside and fixed. The upper case 10 and the lower case 11 may be integrated. Since the casing 12 has a simple rectangular parallelepiped shape, attachment to the vehicle or the like becomes easy, and production is facilitated. As illustrated in FIG. 14, a connector 17 is attached to one side surface of the casing 12 in the longitudinal direction, and an AC terminal 18 is connected to the connector 17.

As illustrated in FIG. 15, the power module 400 is accommodated in the casing 12. the control circuit 172 and the driver circuit 174 are arranged above the power module 400, and the capacitor module 600 is accommodated below the power module 400.

The AC-side terminal 320B of the power module 400 penetrates the current sensor 180 and is joined to a bus bar 361. In addition, the positive-electrode-side terminal 315B and the negative-electrode-side terminal 319B, which are DC terminals of the power module 400, are joined respectively to a positive-electrode-side terminal 362A, a negative-electrode terminal, and 362B of the capacitor module 600.

Note that the AC-side terminal 320B is not bent but extends straight in the power module 400 illustrated in FIG. 15. In addition, the positive-electrode-side terminal 315B and the negative-electrode-side terminal 319B have a short shape cut at the root side.

According to the above-described embodiments, the following operational effects are obtained.

(1) The power module 400 includes: the fin base 440 on which the plurality of heat dissipation fins 331 are erected; the cover member 340 which forms the inclined portion 343 inclined toward the outer periphery of the fin base 440 and forms the flow passage of the refrigerant 451 with the fin base 440; and the resin material 336 that bonds the fin base 440 and the cover member 340 to each other, and the resin material 336 is arranged in the first region 421 surrounded by the fin base 440, the inclined portion 343 of the cover member 340, and the outermost peripheral heat dissipation fin 334 arranged on the outermost peripheral side. As a result, it is possible to provide the power module that prevents the bypass flow of the refrigerant regardless of dimensional accuracy of a member and enhances a cooling effect.

(2) The method for manufacturing the power modules 400 and 500 includes: the first step of applying the resin material 336 onto the fin base 440 to correspond to the inclined portion 343 of the cover member 340 configured to form the flow passage of the refrigerant 451 with the fin base 440, the inclined portion 343 being formed in the cover member 340 and inclined toward the outer periphery of the fin base 440 on which the plurality of heat dissipation fins 331 are erected; and the second step of pressing the cover member 340 against the fin base 440 to bond the cover member 340 and the fin base 440 to each other with the resin material 336 interposed therebetween, and the resin material 336 is arranged in the first region 421 surrounded by the fin base 440, the inclined portion 343 of the cover member 340, and the outermost peripheral heat dissipation fin 334 arranged on the outermost peripheral side. As a result, it is possible to provide the power module that prevents the bypass flow of the refrigerant regardless of dimensional accuracy of a member and enhances a cooling effect.

(Modification)

The present invention can be implemented by modifying the first and second embodiments described above as follows.

(1) Although the double-sided cooling power modules 400 and 500 have been described as examples in the first and second embodiments, a single-sided cooling power module may be used.

The present invention is not limited to the above-described embodiments, and other modes, which are conceivable inside a scope of a technical idea of the present invention, are also included in a scope of the present invention as long as characteristics of the present invention are not impaired. In addition, the invention may be configured by combining the embodiments and modifications.

REFERENCE SIGNS LIST 11 lower case
12 casing
13 inflow pipe
14 outflow pipe
18 AC terminal
43, 140, 142 inverter circuit
150, 155, 157 power semiconductor element
156, 158 diode
172 control circuit
174 driver circuit
180 current sensor
181, 182, 188 connector
192, 194 motor generator
200 power conversion device
300 circuit body
440 fin base
331 heat dissipation fin
332 region heat dissipation fin
334 outermost peripheral heat dissipation fin
336 resin material
338 seal portion
339 welded portion
340 cover member
341 connecting member
343 inclined portion
360 sealing resin
400, 500 power module
410 heat dissipation region
421 first region
422 second region
430 emitter-side conductor
431 collector-side conductor
432 emitter-side wiring board
433 collector-side wiring board
450, 451 refrigerant
600 capacitor module

The invention claimed is:

1. A power module comprising:
a fin base on which a plurality of heat dissipation fins are erected;
a cover member which forms an inclined portion inclined toward an outer periphery of the fin base and forms a flow passage of a refrigerant with the fin base; and
a resin material which bonds the fin base and the cover member to each other,
wherein the resin material is arranged in a first region surrounded by the fin base, the inclined portion of the cover member, and the heat dissipation fin arranged on an outermost peripheral side of the fin base, and
wherein (i) in a cross section perpendicular to a flow direction of the refrigerant in the flow passage, a cross-sectional area of the first region is larger than an average cross-sectional area between adjacent heat dissipation fins of the plurality of heat dissipation fins, and (ii) a cross-sectional area of a second region, formed between the resin material arranged in the first region and the heat dissipation fin arranged on the outermost peripheral side of the fin base, is smaller than the average cross-sectional area between adjacent heat dissipation fins of the plurality of heat dissipation fins.

2. The power module according to claim 1, wherein the resin material arranged in the first region is in contact with the heat dissipation fin arranged on the outermost peripheral side.

3. The power module according to claim 2, wherein the heat dissipation fin in contact with the resin material is a straight fin.

4. The power module according to claim 1, wherein the resin material is an adhesive material having an Al plate as an adherend, and is a material in which cohesive failure occurs in 80% or more of an area when a test piece for determining tensile lap-shear strength conforming to JIS K 6850 is immersed in a long life coolant at 125° C. for 2000 hours in a sealed container and then subjected to a tensile test.

5. The power module according to claim 1, wherein
the inclined portion includes a first inclined portion directed toward the outer periphery of the fin base and a second inclined portion directed toward the heat dissipation fin, and
the second inclined portion has a larger angle than the first inclined portion with respect to the fin base.

6. The power module according to claim 5, wherein the resin material adheres to the first inclined portion and adheres to at least a part of the second inclined portion.

7. The power module according to claim 1, further comprising:
a circuit body having the fin base; and
a connecting member that connects a plurality of the circuit bodies,
wherein
the connecting member is arranged between the fin base and the cover member, and
the resin material is arranged between the fin base and the connecting member and in the first region.

8. The power module according to claim 7, wherein the fin base is a pure aluminum member, and the connecting member and the cover member are made of an alloy aluminum material.

9. The power module according to claim 8, wherein the connecting member and the cover member are made of a 3000-series aluminum material, and the connecting member and the cover member are fixed by laser welding at an outer peripheral portion of the cover member.

10. A power conversion device comprising the power module according to claim 1, the power conversion device performing mutual conversion between DC power and AC power.

11. A method for manufacturing a power module comprising:
a first step of applying a resin material onto a fin base to correspond to an inclined portion of a cover member configured to form a flow passage of a refrigerant with the fin base, the inclined portion being formed in the cover member and inclined toward an outer periphery of the fin base on which a plurality of heat dissipation fins are erected; and
a second step of pressing the cover member against the fin base to bond the cover member and the fin base to each other with the resin material interposed between the cover member and the fin base,
wherein the resin material is arranged in a first region surrounded by the fin base, the inclined portion of the cover member, and the heat dissipation fin arranged on an outermost peripheral side of the fin base, and
wherein the inclined portion includes a first inclined portion directed toward the outer periphery of the fin base and a second inclined portion directed toward the heat dissipation fin, the second inclined portion having a larger angle than the first inclined portion with respect to the fin base.

12. The method for manufacturing a power module according to claim 11, further comprising a third step of welding an outer peripheral portion of the cover member to the fin base.

13. The method for manufacturing a power module according to claim 11, wherein the second step includes a step of bonding a connecting member that connects a plurality of circuit bodies each having the fin base between the cover member and the fin base using the resin material.

14. The method for manufacturing a power module according to claim 11, wherein the resin material adheres to the first inclined portion and adheres to at least a part of the second inclined portion.

15. A power module comprising:
a fin base on which a plurality of heat dissipation fins are erected;
a cover member which forms an inclined portion inclined toward an outer periphery of the fin base and forms a flow passage of a refrigerant with the fin base; and
a resin material which bonds the fin base and the cover member to each other,
wherein the resin material is arranged in a first region surrounded by the fin base, the inclined portion of the cover member, and the heat dissipation fin arranged on an outermost peripheral side of the fin base,
wherein the inclined portion includes a first inclined portion directed toward the outer periphery of the fin base and a second inclined portion directed toward the heat dissipation fin, and
wherein the second inclined portion has a larger angle than the first inclined portion with respect to the fin base.

16. The power module according to claim 15, wherein the resin material adheres to the first inclined portion and adheres to at least a part of the second inclined portion.

17. The power module according to claim 15, wherein the resin material arranged in the first region is in contact with the heat dissipation fin arranged on the outermost peripheral side of the fin base.

18. The power module according to claim 17, wherein the heat dissipation fin in contact with the resin material is a straight fin.

19. The power module according to claim 15, wherein the resin material is an adhesive material having an Al plate as an adherent, and is a material in which cohesive failure occurs in 80% or more of an area when a test piece for determining tensile lap-shear strength conforming to JIS K 6850 is immersed in a long life coolant at 125° C. for 2000 hours in a sealed container and then subjected to a tensile test.

* * * * *